US010921366B2

(12) United States Patent
Dang

(10) Patent No.: US 10,921,366 B2
(45) Date of Patent: Feb. 16, 2021

(54) DETECTION DEVICE AND DETECTION METHOD

(71) Applicant: BOE Technology Group Co., Ltd., Beijing (CN)

(72) Inventor: Wenting Dang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 175 days.

(21) Appl. No.: 16/023,065

(22) Filed: Jun. 29, 2018

(65) Prior Publication Data
US 2019/0064255 A1 Feb. 28, 2019

(30) Foreign Application Priority Data

Aug. 23, 2017 (CN) .......................... 201710728794.7

(51) Int. Cl.
G01R 31/28 (2006.01)
G06T 7/90 (2017.01)
G06T 7/00 (2017.01)
G01R 19/25 (2006.01)

(52) U.S. Cl.
CPC ..... *G01R 31/2825* (2013.01); *G01R 19/2513* (2013.01); *G06T 7/001* (2013.01); *G06T 7/0002* (2013.01); *G06T 7/90* (2017.01); *G06T 2207/30121* (2013.01)

(58) Field of Classification Search
None
See application file for complete search history.

(56) References Cited

U.S. PATENT DOCUMENTS

| 2011/0025368 A1* | 2/2011 | Tsuchiya | H02S 50/00 324/764.01 |
| 2014/0028650 A1* | 1/2014 | Bae | G06F 3/038 345/212 |
| 2014/0035596 A1* | 2/2014 | Lee | G01R 31/00 324/523 |
| 2016/0266590 A1 | 9/2016 | Ura | |
| 2017/0004773 A1 | 1/2017 | Kim et al. | |

FOREIGN PATENT DOCUMENTS

| CN | 106328027 A | 1/2007 |
| CN | 1979438 A | 6/2007 |
| CN | 105976773 A | 9/2016 |
| JP | 2004119151 A | 4/2004 |

OTHER PUBLICATIONS

Office Action for corresponding Chinese Application 201710728794.7 dated Jan. 2, 2020.

* cited by examiner

*Primary Examiner* — Nasima Monsur
(74) *Attorney, Agent, or Firm* — Arent Fox LLP; Michael Fainberg

(57) ABSTRACT

A detection device for detecting a failure of a display device which is powered off during a test includes a micro control unit and a switch control unit. The switch control unit is configured to control an externally connected power source of the display device to be switched on and off alternately; and the micro control unit is configured to detect voltage values of respective components to be powered, in the display device when the externally connected power source is switched off, to compare the voltage values with pre-stored reference voltage values, and if a result of the comparison between them exceeds a preset threshold, to determine a failure of the display device which is powered off.

4 Claims, 3 Drawing Sheets

DETECTION DEVICE AND DETECTION METHOD

CROSS-REFERENCE TO RELATED APPLICATION

This application claims priority of Chinese Patent Application No. 201710728794.7, filed on Aug. 23, 2017, which is hereby incorporated by reference in its entirety.

FIELD

The present disclosure relates to the field of display technologies, and particularly to a detection device and a detection method.

BACKGROUND

While the existing display device is operating, a master control chip in the display device reads data from a solid-state memory in the display device, and if the display device is powered off abnormally while the data are being read, then the data may be lost or become abnormal, thus resulting in a black screen or an abnormal image.

SUMMARY

An embodiment of the disclosure provides a detection device including a memory configured to store computer-readable programs and a processor, wherein the processor is configured to execute the computer-readable programs to:

control an externally connected power source of the display device to be switched on and off alternately; and detect voltage values of respective components to be powered, in the display device when the externally connected power source is switched off, compare the voltage values with pre-stored reference voltage values, and in response to that a result of the comparison between these voltage values exceeds a preset threshold, determine a failure of the display device which is powered off.

Optionally, the detection device further includes a camera further comprises a camera, and the processor is configured to execute the computer-readable programs to:

compare an image captured by the camera on the display screen when the externally connected power source of the display device with a pre-stored reference image, and in response to that these images are different as a result of the comparison, determine a failure of the display device which is powered off.

Optionally, the processor is configured to execute the computer-readable programs to:

before controlling the externally connected power source of the display device to be powered on and off alternately, detect communication between a master control chip in the display device, and a solid-state memory in the display device, and control the externally connected power source of the display device to be powered on and off alternately upon detecting normal communication between the master control chip and the solid-state memory, wherein the control signal is a signal to control the switch control unit to operate.

Optionally, the processor is configured to execute the computer-readable programs to detect voltage values of respective components to be powered, in the display device when the externally connected power source is switched off, by detecting the voltage value of at least one of a power source board, a main board, and a display screen in the display device when the externally connected power source is switched off.

Optionally, the processor is configured to execute the computer-readable programs to compare an image captured by the camera on the display screen when the externally connected power source of the display device with a pre-stored reference image, and in response to that these images are different as a result of the comparison, determine a failure of the display device which is powered off, by comparing the chroma value of captured image with the chroma value of the pre-stored reference image, and in response to that a difference between these chroma values exceeds the preset threshold, determining a failure of the display device which is powered off.

An embodiment of the disclosure further provides a detection method including:

controlling an externally connected power source of a display device to be switched on and off alternately; and detecting voltage values of respective components to be powered, in the display device when the externally connected power source is switched off, comparing the voltage values with pre-stored reference voltage values, and in response to that a result of the comparison between these voltage values exceeds a preset threshold, then determining a failure of the display device which is powered off.

Optionally after the externally connected power source of the display device is controlled to be switched on and off alternately, the method further includes:

receiving an image, captured by a camera, on a display screen in the display screen when the externally connected power source of the display device is switched off, comparing the image with a pre-stored reference image, and in response to that these images are different as a result of the comparison, then determining a failure of the display device which is powered off.

Optionally, before the externally connected power source of the display device is controlled to be switched on and off alternately, the method further includes:

detecting communication between a master control chip in the display device, and a solid-state memory in the display device, and controlling the externally connected power source of the display device to be switched on and off alternately, upon detecting normal communication between the master control chip and the solid-state memory.

Optionally, the detecting voltage values of respective components to be powered, in the display device when the externally connected power source is switched off, comparing the voltage values with pre-stored reference voltage values, and in response to that a result of the comparison between these voltage values exceeds a preset threshold, then determining a failure of the display device which is powered off, includes:

detecting the voltage value of at least one of a power source board, a main board, and a display screen in the display device when the externally connected power source of the display device is switched off, comparing the voltage value with the pre-stored reference voltage value, and in response to that a difference between these voltage values exceeds the preset threshold, then determining a failure of the display device which is powered off.

Optionally, the receiving an image, captured by a camera, on a display screen in the display screen when the externally connected power source of the display device is switched off, comparing the image with a pre-stored reference image, and in response to that these images are different as a result of the comparison, then determining a failure of the display device which is powered off, includes:

receiving the image when the externally connected power source of the display device is switched off, comparing the chroma value of the image with the chroma value of the pre-stored reference image, and in response to that a difference between these images exceeds the preset threshold, then determining a failure of the display device which is powered off.

DETAILED DESCRIPTION OF THE EMBODIMENTS

The display device operating in reality may be powered off abnormally in an uncontrollable manner, and if this phenomenon occurs, then it may fail to be reproduced, or may be difficult to simulate, so a drawback of the display device being manufactured may be hindered from being alleviated.

Embodiments of the disclosure provide a detection device and a detection method so as to detect an operating condition of a display device during a test to thereby improve the reliability of the display device.

In order to make the objects, technical solutions, and advantages of the disclosure more apparent, the disclosure will be described below in further details with reference to the drawings, and apparently the embodiments to be described are only a part but not all of the embodiments of the disclosure. Based upon the embodiments here of the disclosure, all the other embodiments which can occur to those ordinarily skilled in the art without any inventive effort shall fall into the scope of the disclosure.

A detection device according to embodiments of the disclosure will be described below in details with reference to the drawings.

Figure 1:
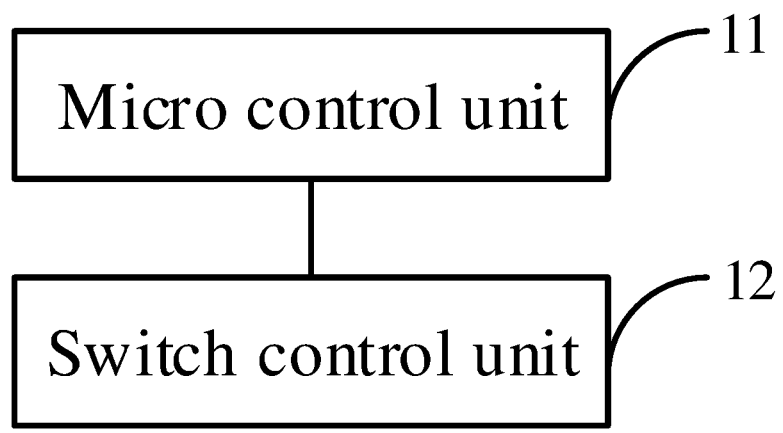
FIG. 1 is a structural block diagram of a detection device according to an embodiment of the disclosure.

As illustrated in FIG. 1, an embodiment of the disclosure provides a detection device for detecting a failure of a display device which is powered off during a test, and the detection device according to the embodiment of the disclosure includes a micro control unit 11 and a switch control unit 12.

The switch control unit 12 is configured to control an externally connected power source of the display device to be switched on and off alternately.

The micro control unit 11 is configured to detect voltage values of respective components to be powered, in the display device when the externally connected power source is switched off, to compare the voltage values with pre-stored reference voltage values, and if a result of the comparison between them exceeds a preset threshold, to determine a failure of the display device which is powered off.

The detection device according to the particular embodiment of the disclosure includes the micro control unit and the switch control unit, and is configured to detect a failure of the display device which is powered off during a test, where the switch control unit is configured to control the externally connected power source of the display device to be switched on and off alternately, and the micro control unit is configured to detect the voltage values of the respective components to be powered, in the display device when the externally connected power source is switched off, to compare the voltage values with the pre-stored reference voltage values, and if the result of the comparison between them exceeds the preset threshold, to determine a failure of the display device which is powered off. The detection device according to the particular embodiment of the disclosure can simulate in advance abnormal powering-off of the display device in use, repeatedly during the test, and can detect an operating condition of the display device, and when the failure of the display device which is powered off is unacceptable to a user, the display device can be regarded as an unqualified product during the test, so that the unqualified product can be well avoided from being provided to the user for use to thereby improve the reliability of the display device.

Figure 2:
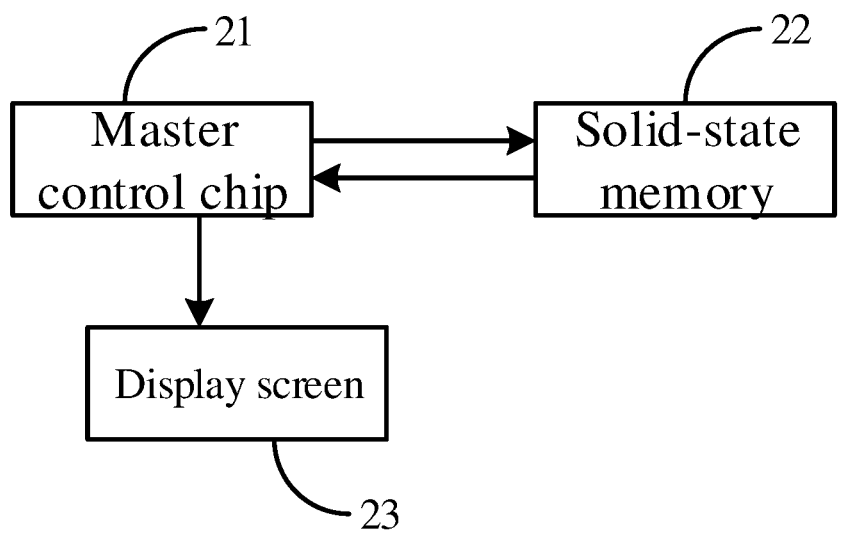
FIG. 2 is a structural block diagram of a display device.

In an optional implementation, as illustrated in FIG. 2, the display device includes a master control chip 21, a solid-state memory 22 (Flash), and a display screen 23, where the master control chip 21 is configured to output a control signal, to process an image, etc., the solid-state memory 22 is configured to store software, and the master control chip 21 reads data from the solid-state memory 22, and outputs a control signal to the display screen 23 for display; and all the structures and operations of the respective components in the display device according to the particular embodiment of the disclosure are conventional, so a repeated description thereof will be omitted here.

Figure 3:
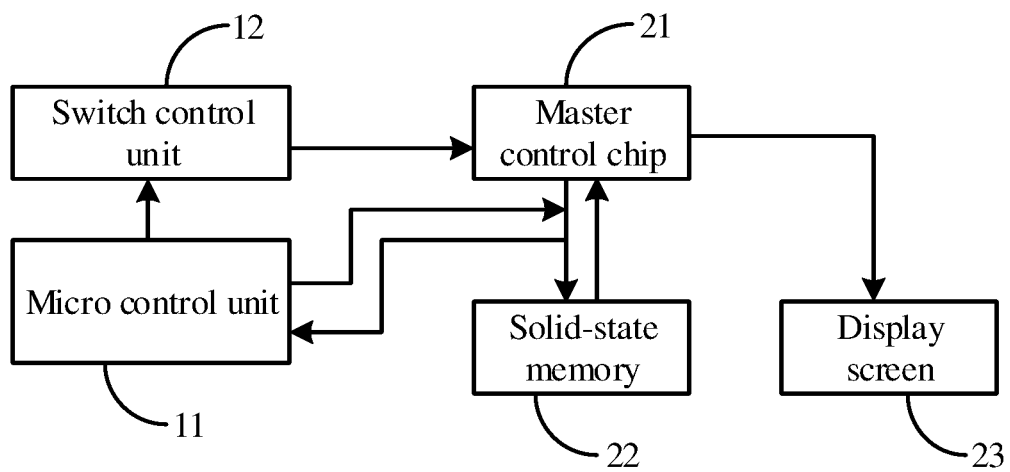
FIG. 3 is a particular structural block diagram of a detection device being in work according to an embodiment of the disclosure.

As illustrated in FIG. 3, before the switch control unit 12 in embodiments of the disclosure controls the externally connected power source of the display device to be powered on and off alternately, the micro control unit 11 is further configured to detect communication between the master control chip 21 and the solid-state memory 22, and to transmit a control signal to the switch control unit 12 upon detecting normal communication between the master control chip 21 and the solid-state memory 22, where the control signal is a signal to control the switch control unit 12 to operate, that is, the switch control unit 12 controls the externally connected power source of the display device to be switched on and off alternately, upon reception of the control signal. In this way, in the particular embodiment of the disclosure, it is firstly determined that the display device is operating normally, while abnormal powering-off is being simulated, so that a failure of the display device which is powered off can be detected more accurately.

Optionally, as illustrated in FIG. 3, the micro control unit 11 in the particular embodiment of the disclosure is configured to detect the voltage value of at least one of a power source board, a main board, and a display screen in the display device when the externally connected power source is switched off, to compare the voltage value with the pre-stored reference voltage value, and if the difference between them exceeds the preset threshold, to determine a failure of the display device which is powered off. Of course, other parameters can alternatively be compared in a real production process. In the particular embodiment of the disclosure, after a failure is determined, failure data of each failure, and a condition under which the failure data occur are recorded in details, so that the failure records can be reviewed after the detection device finishes the detection.

Figure 4:
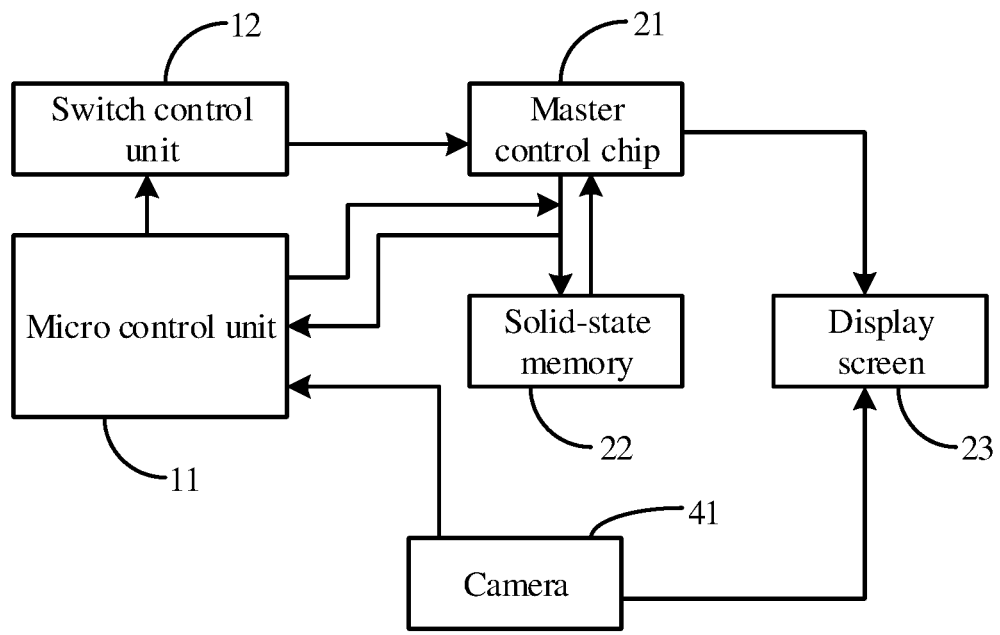
FIG. 4 is a particular structural block diagram of another detection device being in work according to an embodiment of the disclosure.

Optionally, as illustrated in FIG. 4, the detection device in embodiments of the disclosure further includes a camera 41 configured to capture an image on the display screen 23, and to transmit the captured image on the display screen 2311 when the externally connected power source of the display device is powered off, to the micro control unit; and the micro control unit 11 is further configured to compare the received image with a pre-stored reference image, and if they are different as a result of the comparison, to determine a failure of the display device which is powered off.

Optionally, the micro control unit 11 in embodiments of the disclosure is configured to compare the chroma value of the received image with the chroma value of the pre-stored reference image, and if the difference between them exceeds the preset threshold, to determine a failure of the display device which is powered off. Of course, other parameters of the image, e.g., the grayscale value of the image, etc., can alternatively be compared in a real production process. Furthermore in the particular embodiment of the disclosure, after a failure of the display device which is powered off is determined, failure data of each failure, and a condition under which the failure data occur are recorded in details.

In an optional implementation, the chroma value of a simply monochromatic image is detected; and for example, the master control chip 21 of the display device controls the display screen 23 to display a red image, the camera 41 captures the red image, and transmits the captured red image when the power source of the display device is powered off, to the micro control unit 11, and the micro control unit 11 compares the chroma value of the received red image with the chroma value of a pre-stored reference red image. In this way, in the particular embodiment of the disclosure, the micro control unit 11 can determine whether the data of the image are normally, according to a result of comparing the chroma value of the received red image with the chroma value of the pre-stored reference red image. Of course, in the particular embodiment of the disclosure, the ratio of the chroma values of Red (R), Green (G), and Blue (B) component can alternatively be compared in a real production process, and the micro control unit 11 can compare the ratio of chroma values of R, G, and B in the received image with the ratio of chroma values of R, G, and B in the pre-stored reference red image, and determine a failure of the display device which is powered off.

In an optional embodiment of the disclosure, a number of tests can be preset as needed for the user, the failure records can be reviewed after the tests are finished, and if there are a number of consecutive failures (e.g., five failures, where the number of failures can be set as needed in reality), then the detection device will not detect any longer, but determine that there are data which are lost abnormally, and at this time, the display device will be regarded as an unqualified product, so that such an unqualified display device can be avoided from being shipped out of a factory, thus guaranteeing the reliability of the display device shipped out of the factory.

In summary, a particular embodiment of the disclosure provides a detection device for detecting a failure of a display device which is powered off during a test, the detection device including a micro control unit and a switch control unit, where the switch control unit is configured to control an externally connected power source of the display device to be switched on and off alternately; and the micro control unit is configured to detect voltage values of respective components to be powered, in the display device when the externally connected power source is switched off, to compare the voltage values with pre-stored reference voltage values, and if a result of the comparison between them exceeds a preset threshold, to determine a failure of the display device which is powered off. The detection device according to the particular embodiment of the disclosure can simulate in advance abnormal powering-off of the display device in use, repeatedly during the test, and can detect an operating condition of the display device, and when the failure of the display device which is powered off is unacceptable to a user, the display device can be regarded as an unqualified product during the test, so that the unqualified product can be well avoided from being provided to the user for use to thereby improve the reliability of the display device.

Figure 5:
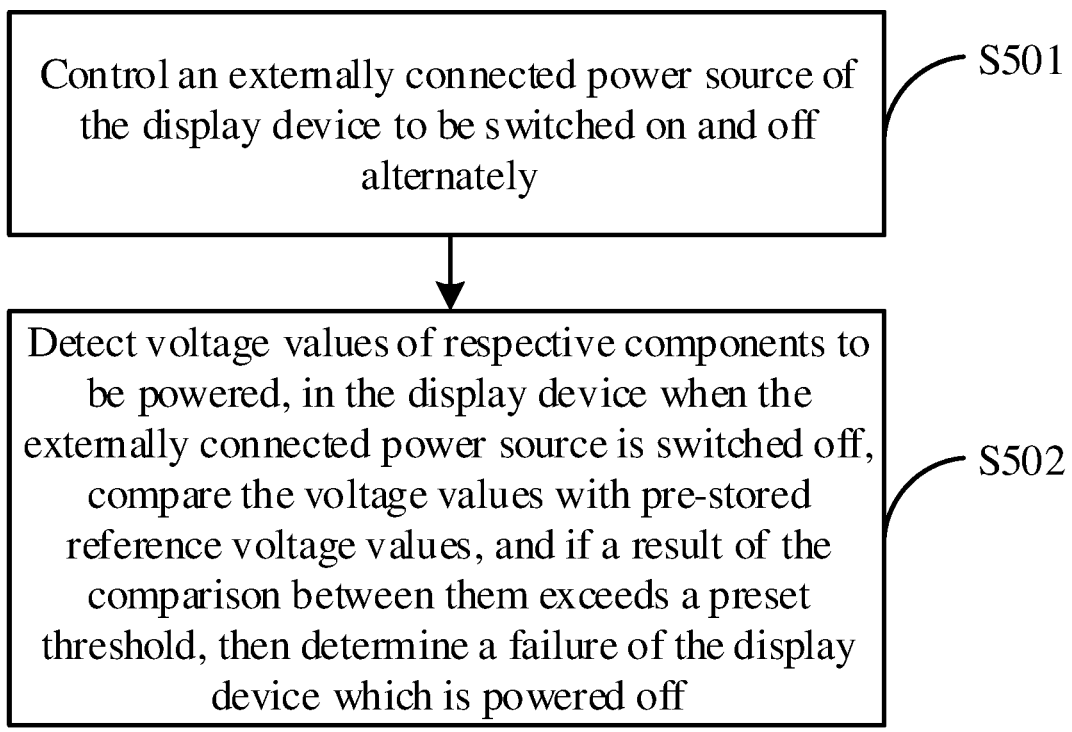
FIG. 5 is a flow chart of a detection method according to an embodiment of the disclosure.

Based upon the same inventive idea, some embodiments of the disclosure further provide a detection method for detecting a failure of a display device which is powered off during a test, and as illustrated in FIG. 5, the method includes the following steps.

S501 is to control an externally connected power source of the display device to be switched on and off alternately.

S502 is to detect voltage values of respective components to be powered, in the display device when the externally connected power source is switched off, to compare the voltage values with pre-stored reference voltage values, and if a result of the comparison between them exceeds a preset threshold, to determine a failure of the display device which is powered off.

Optionally, in embodiments of the disclosure, after the externally connected power source of the display device is controlled to be switched on and off alternately, the method further includes followings.

Receiving an image, captured by a camera, on a display screen in the display screen when the externally connected power source of the display device is switched off, comparing the image with a pre-stored reference image, and if they are different as a result of the comparison, then determining a failure of the display device which is powered off.

In an optional implementation, the detection device receives the image when the externally connected power source of the display device is switched off, compares the chroma value of the with the chroma value of the pre-stored reference image, and if the difference between them exceeds the preset threshold, then the detection device will determine a failure of the display device which is powered off.

Optionally, in embodiments of the disclosure, before the externally connected power source of the display device is controlled to be switched on and off alternately, the method further includes followings.

Detecting communication between a master control chip in the display device, and a solid-state memory in the display device, and controlling the externally connected power source of the display device to be switched on and off alternately, upon detecting normal communication between the master control chip and the solid-state memory.

In an optional implementation, the detection method according to the particular embodiment of the disclosure includes: detecting the voltage value of at least one of a power source board, a main board, and a display screen in the display device when the externally connected power source of the display device is switched off, comparing the voltage value with the pre-stored reference voltage value, and if the difference between them exceeds the preset threshold, then determining a failure of the display device which is powered off.

In an optional embodiment of the disclosure, after a failure of the display device which is powered off is determined, failure data of each failure are recorded, so that the failure records can be reviewed after the test is finished; and in the particular embodiment of the disclosure, a number of tests can be preset as needed for a user, the failure records can be reviewed after the tests are finished, and if there are a number of consecutive failures (e.g., five failures), then the detection device will not detect any longer, but determine that there are data which are lost abnormally, and at this time, the display device will be regarded as an unqualified product, so that such an unqualified display device can be avoided from being shipped out of a factory, thus guaranteeing the reliability of the display device shipped out of the factory.

Based upon the same inventive idea, some embodiments of the disclosure further provide another detection device including a memory and a processor. The memory is configured to store computer-readable programs. The processor is configured to execute the computer-readable programs to perform any one of detection methods in above embodiments. The description for the detection methods are omitted so as to avoid repeat.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A detection device comprising a memory configured to store computer-readable programs and a processor, wherein the processor is configured to execute the computer-readable programs to:
control an externally connected power source of the display device to be switched on and off alternately; and
detect voltage values of one or more components to be powered of the display device when the externally connected power source is switched off, compare the voltage values with pre-stored reference voltage values, and in response to that a result of the comparison between these voltage values exceeds a preset threshold, determine a failure of the display device which is powered off;
wherein the detection device further comprises a camera, and the processor is configured to execute the computer-readable programs to:
compare a chroma value of an image captured by the camera on a display screen when the externally connected power source of the display device is switched off with a chroma value of a pre-stored reference image, and in response to that a difference between these chroma values exceeds the preset threshold, determine a failure of the display device which is powered off;
wherein the processor is configured to execute the computer-readable programs to:
before controlling the externally connected power source of the display device to be powered on and off alternately, detect communication between a master control chip in the display device, and a solid-state memory in the display device, and control the externally connected power source of the display device to be powered on and off alternately upon detecting normal communication between the master control chip and the solid-state memory.

2. The detection device according to claim 1, wherein the processor is configured to execute the computer-readable programs to detect voltage values of respective components to be powered, in the display device when the externally connected power source is switched off, by:
detecting the voltage value of at least one of a power source board, a main board, and the display screen in the display device when the externally connected power source is switched off.

3. A detection method comprising:
controlling an externally connected power source of a display device to be switched on and off alternately; and
detecting voltage values of one or more components to be powered of the display device when the externally connected power source is switched off, comparing the voltage values with pre-stored reference voltage values, and in response to that a result of the comparison between these voltage values exceeds a preset threshold, then determining a failure of the display device which is powered off;
wherein after the externally connected power source of the display device is controlled to be switched on and off alternately, the method further comprises:
receiving an image, captured by a camera, on a display screen in the display device when the externally connected power source of the display device is switched off, comparing a chroma value of the image with a chroma value of a pre-stored reference image, and in response to that a difference between these images exceeds the preset threshold, then determining a failure of the display device which is powered off;
wherein before the externally connected power source of the display device is controlled to be switched on and off alternately, the method further comprises:
detecting communication between a master control chip in the display device, and a solid-state memory in the display device, and controlling the externally connected power source of the display device to be switched on and off alternately, upon detecting normal communication between the master control chip and the solid-state memory.

4. The method according to claim 3, wherein the detecting voltage values of respective components to be powered, in the display device when the externally connected power source is switched off, comparing the voltage values with pre-stored reference voltage values, and in response to that a result of the comparison between these voltage values exceeds a preset threshold, then determining a failure of the display device which is powered off, comprises:
detecting the voltage value of at least one of a power source board, a main board, and the display screen in the display device when the externally connected power source of the display device is switched off, comparing the voltage value with the pre-stored reference voltage value, and in response to that a difference between these voltage values exceeds the preset threshold, then determining a failure of the display device which is powered off.

* * * * *